(12) United States Patent
Avner et al.

(10) Patent No.: US 8,030,968 B1
(45) Date of Patent: Oct. 4, 2011

(54) STAGED PREDRIVER FOR HIGH SPEED DIFFERENTIAL TRANSMITTER

(75) Inventors: Eugene Avner, Haifa (IL); Ofer Ginzberg, Haifa (IL); Ziv Shmuely, Haifa (IL)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 12/755,909

(22) Filed: Apr. 7, 2010

(51) Int. Cl.
*H03K 19/0175* (2006.01)
(52) U.S. Cl. ........... 326/85; 326/62; 326/82; 326/83; 326/84; 326/86; 327/108
(58) Field of Classification Search ............ 326/62, 326/68, 82–87, 89–91; 327/108–109, 333
See application file for complete search history.

(56) References Cited

U.S. PATENT DOCUMENTS

| | | | | | |
|---|---|---|---|---|---|
| 4,612,459 | A | * | 9/1986 | Pollachek | 326/68 |
| 5,138,194 | A | * | 8/1992 | Yoeli | 326/33 |
| 5,194,763 | A | * | 3/1993 | Suzuki et al. | 326/86 |
| 5,194,765 | A | * | 3/1993 | Dunlop et al. | 326/87 |
| 5,218,239 | A | * | 6/1993 | Boomer | 326/27 |
| 5,243,229 | A | * | 9/1993 | Gabara et al. | 307/98 |
| 5,298,800 | A | * | 3/1994 | Dunlop et al. | 327/108 |
| 5,424,662 | A | * | 6/1995 | Bonaccio | 327/55 |
| 5,850,159 | A | * | 12/1998 | Chow et al. | 327/394 |
| 6,051,995 | A | * | 4/2000 | Pollachek | 326/87 |
| 6,087,847 | A | * | 7/2000 | Mooney et al. | 326/30 |
| 6,091,656 | A | * | 7/2000 | Ooishi | 365/226 |
| 6,094,069 | A | * | 7/2000 | Magane et al. | 326/83 |
| 6,094,086 | A | * | 7/2000 | Chow | 327/396 |
| 6,317,069 | B1 | * | 11/2001 | Male et al. | 341/154 |
| 6,396,329 | B1 | * | 5/2002 | Zerbe | 327/336 |
| 6,417,705 | B1 | * | 7/2002 | Tursi et al. | 327/158 |
| 6,704,818 | B1 | * | 3/2004 | Martin et al. | 710/100 |
| 6,967,501 | B1 | * | 11/2005 | Butka | 326/30 |
| 6,982,587 | B2 | * | 1/2006 | Chen et al. | 327/355 |
| 7,053,679 | B2 | * | 5/2006 | Rho | 327/108 |
| 7,170,324 | B2 | * | 1/2007 | Huber et al. | 327/170 |
| 7,176,721 | B2 | * | 2/2007 | Ho et al. | 326/82 |
| 7,199,615 | B2 | * | 4/2007 | Stojanovic et al. | 326/82 |
| 7,215,144 | B2 | * | 5/2007 | Mitby et al. | 326/82 |
| 7,233,164 | B2 | * | 6/2007 | Stojanovic et al. | 326/22 |
| 7,236,013 | B2 | * | 6/2007 | Kasanyal et al. | 326/83 |
| 7,313,187 | B2 | * | 12/2007 | Chang | 375/257 |
| 7,315,186 | B2 | * | 1/2008 | Martin et al. | 326/87 |
| 7,355,453 | B2 | * | 4/2008 | Watt | 326/87 |

(Continued)

OTHER PUBLICATIONS

PCI Express Base Specification Revision 2.1, pp. 1-704, Mar. 4, 2009.

(Continued)

*Primary Examiner* — Shawki Ismail
*Assistant Examiner* — Matthew C Tabler
(74) *Attorney, Agent, or Firm* — Schwabe, Williamson & Wyatt, P.C.

(57) ABSTRACT

According to various embodiments, a differential transmitter includes a driver and a predriver. In various embodiments, the predriver may include pull-up transistors and pull-down transistors configured in various ways to produce a staged output signal during a pull-up transition, wherein the higher bits of the input signal are switched slower in comparison with the lower bits of the input signal, while at the same time maintaining the simultaneous pull-down transition among all the bits. In various embodiments, the staged output of a predriver may further be dynamically disabled during a deemphasis exit transition. Other embodiments may be described and claimed.

24 Claims, 8 Drawing Sheets

U.S. PATENT DOCUMENTS

| | | | |
|---|---|---|---|
| 7,423,454 B2 * | 9/2008 | Stojanovic et al. | 326/83 |
| 7,446,576 B2 * | 11/2008 | Fiedler | 327/108 |
| 7,471,107 B1 * | 12/2008 | Fortin et al. | 326/83 |
| 7,521,957 B2 * | 4/2009 | Koo | 326/30 |
| 7,595,645 B2 * | 9/2009 | Fujisawa et al. | 324/601 |
| 7,656,209 B2 * | 2/2010 | Mei | 327/170 |
| 7,663,422 B1 * | 2/2010 | Lee | 327/333 |
| 7,688,120 B2 * | 3/2010 | Kim | 327/112 |
| 7,719,307 B2 * | 5/2010 | Lee | 326/30 |
| 7,791,367 B1 * | 9/2010 | Pelley | 326/30 |
| 7,808,278 B2 * | 10/2010 | Nguyen et al. | 326/87 |
| 7,821,289 B2 * | 10/2010 | Lee | 326/27 |
| 7,825,843 B2 * | 11/2010 | Ikoma | 341/144 |
| 7,852,126 B2 * | 12/2010 | Yokoyama | 327/112 |
| 2003/0067325 A1 * | 4/2003 | Haycock et al. | 326/82 |
| 2003/0128596 A1 * | 7/2003 | Peterson et al. | 365/189.11 |
| 2004/0008059 A1 * | 1/2004 | Chen et al. | 327/112 |
| 2005/0018778 A1 * | 1/2005 | Chang | 375/257 |
| 2006/0158225 A1 * | 7/2006 | Stojanovic et al. | 326/87 |
| 2006/0220674 A1 * | 10/2006 | Yeung et al. | 326/29 |
| 2006/0267634 A1 * | 11/2006 | Koo | 326/86 |
| 2007/0115026 A1 * | 5/2007 | Krishnan et al. | 326/30 |
| 2008/0054981 A1 * | 3/2008 | Hosoe et al. | 327/333 |
| 2009/0066376 A1 * | 3/2009 | Chen et al. | 327/112 |
| 2009/0091349 A1 * | 4/2009 | Bhakta et al. | 326/30 |
| 2009/0168549 A1 * | 7/2009 | Jeon | 365/189.05 |
| 2009/0168854 A1 * | 7/2009 | Liang et al. | 375/219 |
| 2009/0201070 A1 * | 8/2009 | Wilson et al. | 327/333 |
| 2010/0283507 A1 * | 11/2010 | Chen et al. | 326/83 |

OTHER PUBLICATIONS

Video Electronics Standards Association, VESA DisplayPort Standard, Version 1, Revision 1a, pp. 1-238. Jan. 11, 2008.

* cited by examiner

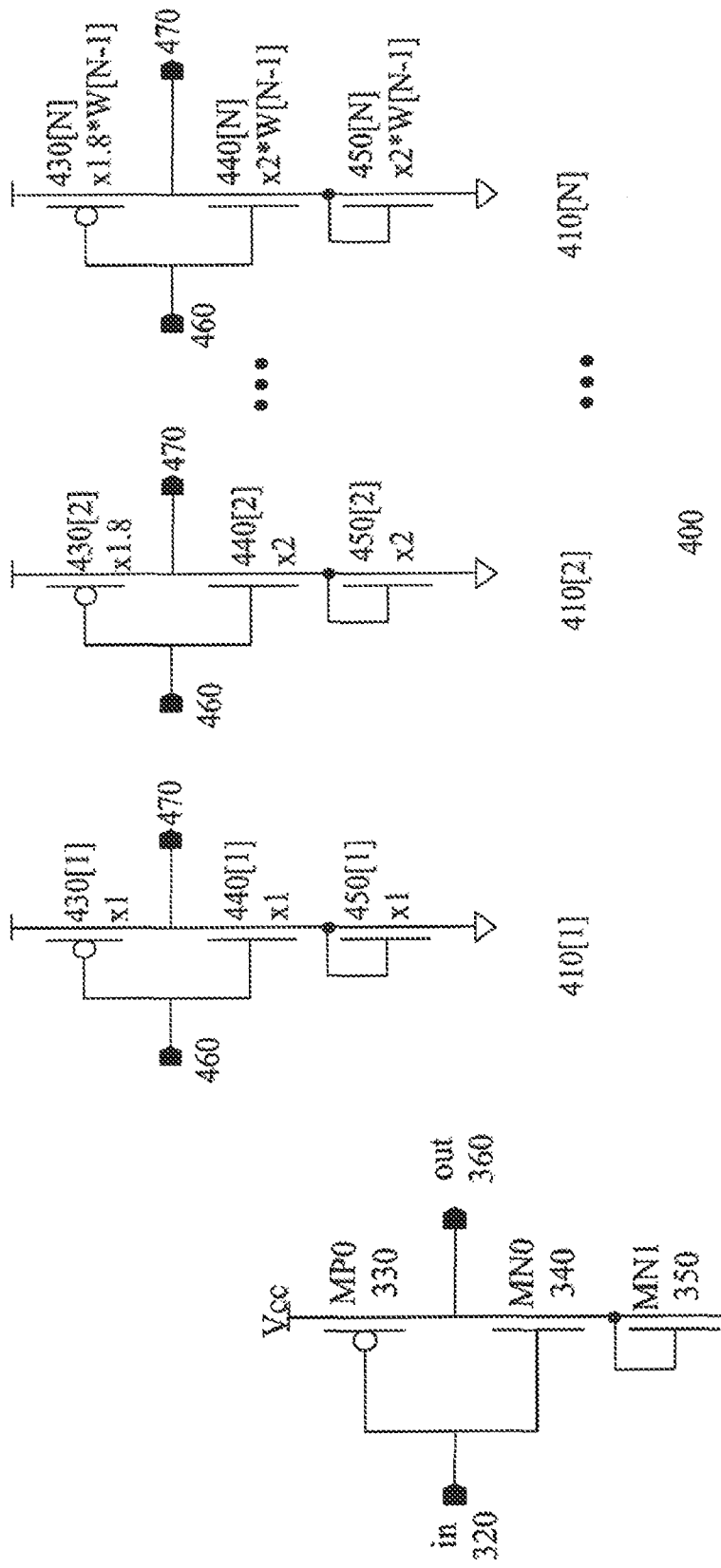

Main driver output waves and common-mode
— outp
- - - outn
-.-.- ac cm
FIG. 8
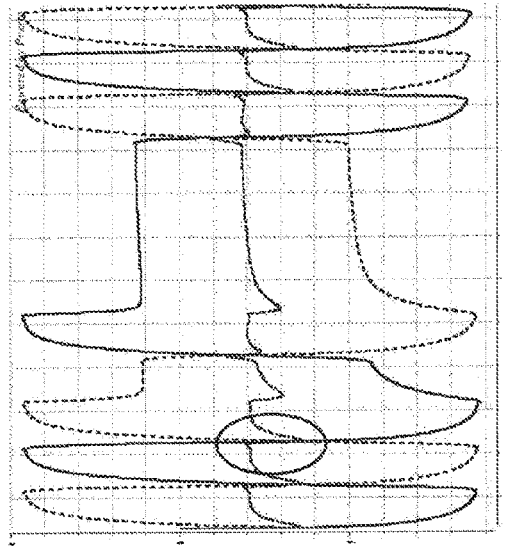
(a) Predriver without staging
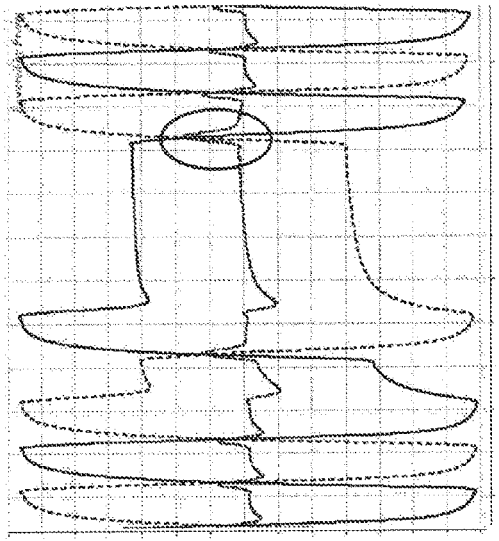
(b) Predriver with staging
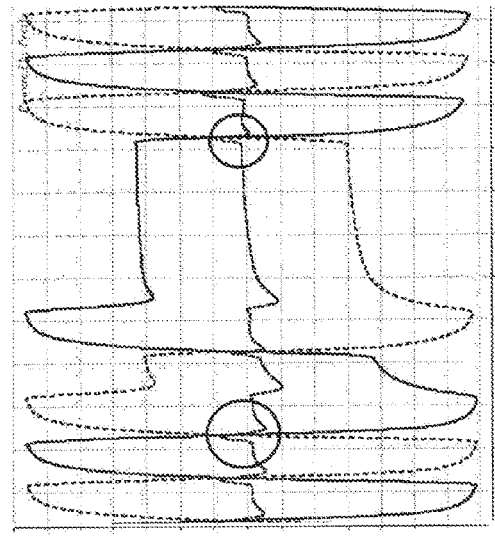
(c) Predriver with dynamic staging

STAGED PREDRIVER FOR HIGH SPEED DIFFERENTIAL TRANSMITTER

TECHNICAL FIELD

Embodiments of the present invention relate to the field of integrated circuits, in particular, driver and predriver circuits for high-speed differential transmitters.

BACKGROUND

Differential signal transmission, in general, is a known method of transmitting information electrically from a transmitting device (or transmitter) to a receiving device (or receiver), by means of two complementary signals sent on two separate traces in which the receiver recovers the information based on the difference between the two complementary signals. In general, the receiver ignores the traces' voltages with respect to ground, therefore, small changes in ground potential between transmitter and receiver do not affect the receiver's ability to detect the signal. Therefore, better tolerance of ground offsets, low switching noise and better noise immunity under low voltage levels may be achieved with differential transmission. The technique may be used in both analog signaling, as in some audio systems, and digital signaling, as in high-speed serial I/O interfaces.

A pre-driver and a driver generally refer to electronic circuits of a transmitter used to condition and transmit the conditioned differential signals to a receiver. A predriver may predrive a signal to improve the characteristics and/or quality of the signal before it is delivered to a driver for transmission to the receiver.

In high speed transmission, there are losses in the transmission lanes. In order to compensate for the losses, driver circuits associated with the transmission lanes may use "deemphasis" or "pre-emphasis" to reduce the transmit data amplitude for repeating bits of the transmit data. More specifically, transmit data may be driven at full amplitude (full-swing mode) for each polarity (or state) transition (e.g., 0 to 1, 1 to 0, 1 to −1, −1 to 1, etc.) and thereafter repeating bits of the same polarity (or state) may be driven at reduced amplitude (deemphasis mode). For example, PCI Express Base Specification, Revision 2.1, published Mar. 4, 2009, mandates de-emphasis treatment of repeating bits of same polarity. For another example, VESA DisplayPort Standard, Version 1, Revision 1a, released Jan. 11, 2008, requires pre-emphasis treatment of repeating bits.

In general, two relatively important requirements of a pre-driver for high-speed differential interfaces may be 1) a matched up/down skew with the main differential driver output signals, and 2) a stable common-mode voltage. An issue associated with high-speed differential transmitters may be that the speed of a down output driver transition may not match the speed of an up output driver transition. For example, for a NMOS type driver where the current source is connected to the ground, a down output driver transition may be faster than an up output driver transition. This may occur due to the down output driver transition being dominated by strong current sources quickly discharging highly capacitive output nodes whereas the up transition being dominated by passive resistors, commonly implemented via on-die termination (ODT), charging the opposite output nodes at a slower pace. Similarly, for a PMOS type driver, where the current source is connected to the Vcc, an up output driver transition may be faster than a down output driver transition. In both cases, this may cause up/down output signal slope mismatch between the predriver and the driver, which may lead to higher jitter, less system margins and degradation of overall performance.

BRIEF DESCRIPTION OF THE DRAWINGS

Embodiments of the present disclosure will be described by way of exemplary illustrations, but not limitations, shown in the accompanying drawings in which like references denote similar elements, and in which:

FIG. 3 illustrates in more detailed fashion a predriver cell as shown in FIG. 2 in accordance with various embodiments;

FIG. 4 illustrates in more detailed fashion the weighted structure of a predriver configured to achieve a staged waveform during an up transition in accordance with various embodiments;

FIG. 8 illustrates simulation results of the main differential driver output waves (a) without staged predriver, (b) with staged predriver, and (c) with dynamically staged predriver, in accordance with various embodiments.

DETAILED DESCRIPTION OF ILLUSTRATIVE EMBODIMENTS

Figure 1:
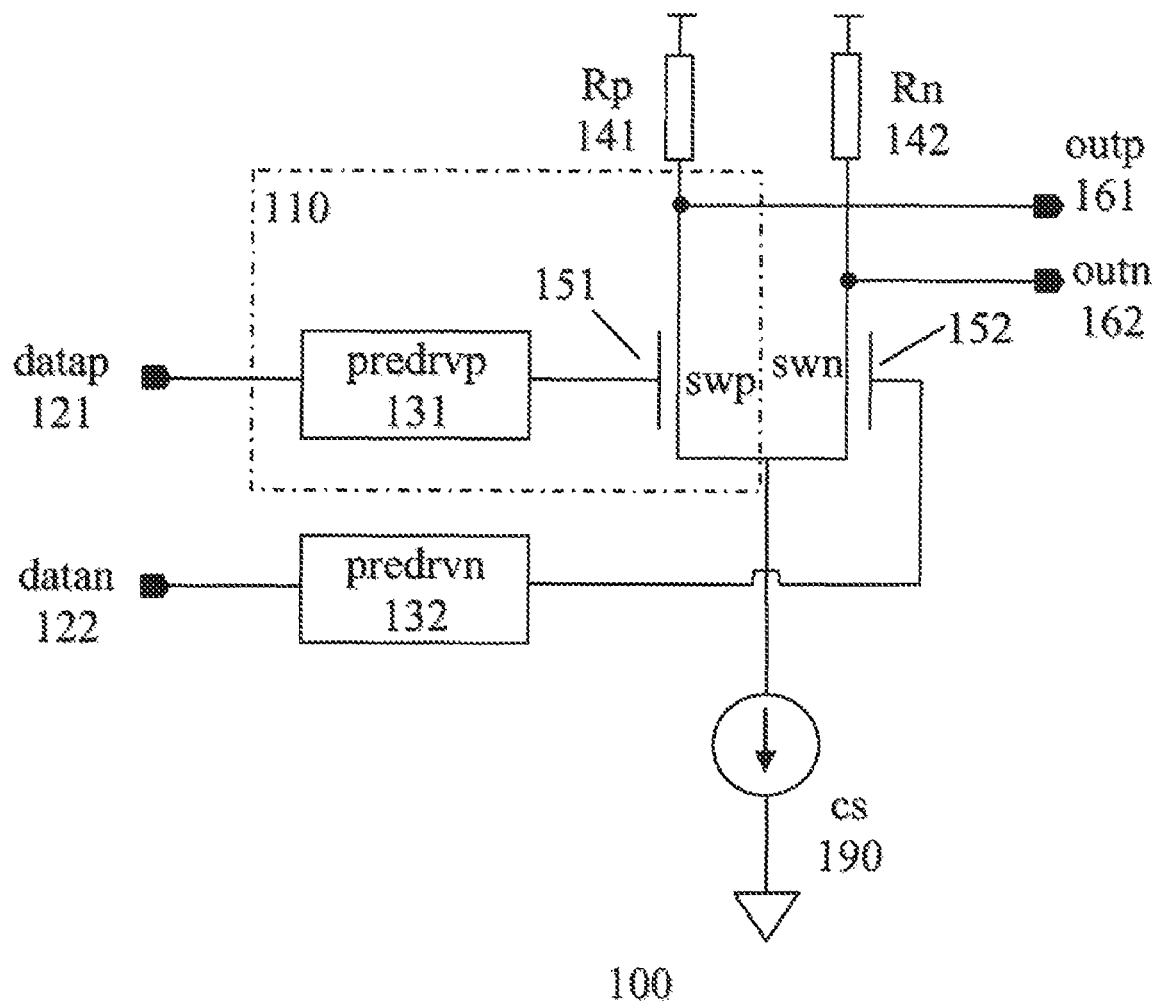
FIG. 1 illustrates a diagram of an example differential transmitter, comprising a driver and a predriver in accordance with various embodiments.

In the following detailed description, reference is made to the accompanying drawings which form a part hereof, and in which are shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact.

However, "coupled" may also mean that two or more elements are not in direct contact with each other, but yet still cooperate or interact with each other.

For the purposes of the description, a phrase in the form "A/B" or in the form "A and/or B" means (A), (B), or (A and B). For the purposes of the description, a phrase in the form "at least one of A, B, and C" means (A), (B), (C), (A and B), (A and C), (B and C), or (A, B and C). For the purposes of the description, a phrase in the form "(A)B" means (B) or (AB) that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

The description may use various terms such as "gate," "switch," "transistor," "resistor," "diode," "PMOS" and "NMOS" etc. to represent various components used in various embodiments. It is understood that these components may be implemented in various ways and/or be replaced by components of similar functionality. For example, a "resistor" may be implemented with a plurality of resistors and/or transistors. Similarly, a "switch" may be implemented by a variety of transistors and/or logic gates, and may comprise a plurality of switches implemented by transistors and/or gates. Therefore, the terms used throughout this disclosure are for purpose of illustration only, not to be construed as limitations.

Throughout this disclosure, the term "circuit" may refer to a complete integrated circuit, or a part thereof.

In various embodiments, an apparatus may include a first circuit cell having a first component and a second component to receive a least significant bit of a input signal; and a second circuit cell having a third component and a fourth component to receive a next higher order bit of the input signal, wherein the third component may be structurally larger than the first component by a first coefficient, and the forth component may be structurally larger than the second component by a second coefficient, the second coefficient being different from the first coefficient.

In various embodiments, the first component may be a pull-down transistor of the first circuit cell, the second component may be a pull-up transistor of the first circuit cell, the third component may be a pull-down transistor of the second circuit cell, and the fourth components may be a pull-up transistor of the second circuit cell.

In various embodiments, the apparatus may further include a first diode-connected transistor and a second diode-connected transistor coupled in series to the pull-up transistors and pull-down transistors of the respective first and second circuit cells.

In various embodiments, the second diode-connected transistor may be structurally bigger in size than the first diode-connected transistor by the first coefficient.

In various embodiments, the first coefficient may be about 2 and the second coefficient may be about 1.8.

In various embodiments, the apparatus may further include a complementary pull-up transistor coupled in parallel to the pull-up transistor of the second circuit cell, the complementary pull-up transistor configured to receive a control signal adapted to dynamically enable the complementary pull-up transistor during deemphasis exit transitions.

In various embodiments, the complementary pull-up transistor may be structured based on a difference in size between the pull-down transistor and the pull-up transistor of the second circuit cell.

In various embodiments, the apparatus may further include a plurality of circuit cells configured to receive remaining bits of the input signal respectively, respective ones of the plurality of circuit cells having a pull-up transistor, a pull-down transistor, and a diode-connected transistor, wherein the pull-down transistors of the respective ones of the plurality of circuit cells may be structurally larger in size than corresponding pull-down transistors of circuit cells of immediate lower order bits by the first coefficient, and the pull-up transistors of the respective ones of the plurality of circuit cells may be structurally larger in size than corresponding pull-up transistors of the circuit cells of immediate lower order bits by the second coefficient.

In various embodiments, the apparatus may further include a plurality of complementary pull-up transistors coupled in parallel with corresponding pull-up transistors of the respective ones of the plurality of circuit cells, the plurality of complementary pull-up transistors configured to respectively receive a plurality of control signals adapted to dynamically enable respective ones of the plurality of complementary pull-up transistors during deemphasis exit transitions.

In various embodiments, the apparatus may be a pre-driver circuit for a differential transmitter configured to drive output signals differentially.

In various embodiments, the apparatus may be an integrated circuit comprising a current-mode serial I/O driver circuit configured to drive output signals differentially.

In various embodiments, a method may include receiving a plurality of input signals of a plurality of ordered bits by a predriver circuit having a plurality of circuit cells respectively, respective ones of the plurality of circuit cells comprising a first component and a second component; and pre-driving the plurality of input signals and generating, in response, a plurality of output signals of the ordered bits, including switching on the first component of the respective ones of the plurality of circuit cells to down transition the plurality of output signals of the ordered bits simultaneously, and switching on the second component of the respective ones of the plurality of circuit cells gradually, from cells of lower order bits to cells of higher order bits, to up transition the lower order bits faster than the higher order bits.

In various embodiments, the first component of the respective ones of the plurality of circuit cells may be a pull-down transistor, and wherein the second component of the respective ones of the plurality of circuit cells may be a pull-up transistor.

In various embodiments, the respective ones of the circuit cells may further include a third component, and the method may further include maintaining respectively output "low" voltage (Vol) of the respective ones of the plurality of circuit cells around threshold voltage (Vth) of the third component.

In various embodiments, the third component may be a diode-connected transistor.

In various embodiments, the pull-down transistors of the plurality of circuit cells may be structurally weighted based on a first coefficient with regard to corresponding pull-down transistors of circuit cells of immediate lower order bits, and wherein the pull-up transistors of the plurality of circuit cells may be structurally weighted based on a second coefficient with regard to corresponding pull-up transistors of circuit cells of immediate lower order bits, and the second coefficient may be smaller than the first coefficient.

In various embodiments, the respective ones of the plurality of circuit cells other than a circuit cell corresponding to a least significant bit of the input signal may further include a fourth component, and the method may further include switching on the second component and the fourth component of the respective ones of the plurality of circuit cells to up transition the plurality of output signals of the ordered bits simultaneously in response to a deemphasis exit transition in the input signals.

In various embodiments, the fourth component may be a complementary pull-up transistor.

In various embodiments, a system may include a source configured to provide a current; a positive driver and a negative driver coupled to the source; a positive predriver and a negative predriver respectively coupled to the positive driver and the negative driver, and configured to respectively receive a positive and a negative input signal associated with a plurality of bits, wherein the respective positive and negative predrivers may include a plurality of circuit cells configured to receive respective ones of the plurality of bits of the positive or negative input signal, respective ones of the plurality of circuit cells having a first component and a second component, in which the first components of the respective ones of the plurality of circuit cells may be structurally weighted by a first coefficient with regard to corresponding first components of circuit cells of immediate lower order bits, and the second components of the respective ones of the plurality of circuit cells may be structurally weighted by a second coefficient with regard to corresponding second components of circuit cells of immediate lower order bits, the second coefficient being smaller than the first coefficient.

In various embodiments, the first component may be a pull-down transistor and the second component is a pull-up transistor.

In various embodiments, the system may further include a plurality of diode-connected transistors respectively coupled in series to the pull-up transistor and the pull-down transistors of the respective ones of the plurality of circuit cells, in which respective ones of the plurality of diode-connected transistors may be structurally weighted based on the first coefficient with regard to corresponding ones of the plurality of diode-connected transistors of the circuit cells of immediate lower order bits.

In various embodiments, the first coefficient may be about 2 and the second coefficient may be about 1.8.

In various embodiments, the system may further include a plurality of complementary pull-up transistors respectively coupled in parallel to the pull-up transistors of the respective ones of the plurality of circuit cells other than a circuit cell configured to receive a least significant bit of the input signal, the plurality of complementary pull-up transistors configured to receive respectively control signals may be adapted to dynamically enable respective ones of the plurality of complementary pull-up transistors during deemphasis exit transitions.

In various embodiments, the respective ones of the plurality of complementary pull-up transistors are structurally weighted based on a third coefficient with regard to corresponding complementary pull-up transistors of circuit cells of immediate lower order bits, the third coefficient may be equal to a difference between the first and the second coefficient.

In a serial input-output (I/O) differential transmission circuit, a predriver and/or driver may be used to condition and drive the differential signals for transmission to a receiver. The driver's down output transition may not match the up signal transition. For NMOS type drivers, this may occur due to down output transition being dominated by strong current source discharging highly capacitive output nodes while up transition being dominated by passive resistors that charge the opposite output nodes. Therefore, the NMOS driver's down output transition may often be faster than the up output transition. In various embodiments, in order to match the response curve of the driver, the predriver also may be configured to slow down during the up transition while maintaining a fast down transition. Resultantly, the up/down slope mismatch between the predriver and the driver may be reduced or avoided, and in turn high jitter and/or instability may likewise be reduced or eliminated.

According to various embodiments, a differential transmitter may include a driver and a predriver. In various embodiments, the predriver may include pull-up transistors and pull-down transistors configured in various ways to produce a staged output signal during a pull-up transition, wherein the higher bits of the input signal may be switched slower in comparison with the lower bits of the input signal, while at the same time substantially maintaining the simultaneous pull-down transition among all the bits. In various embodiments, the staged output of a predriver may further be dynamically disabled during deemphasis exit transitions.

FIG. 1 illustrates a diagram of an example differential transmitter 100, comprising a driver and a predriver in accordance with various embodiments. Throughout this disclosure, in order to help differentiate the driver circuit from the predriver circuit, the term "main driver" may be used in place of "driver." Accordingly, the terms "main driver" and "driver" are to be considered synonymous, unless the context clearly indicates otherwise.

As illustrated, for the embodiments, an example differential transmitter circuit 100 may include input terminals 121 for providing positive input data signals to the predriver circuit 131, and input terminals 122 for providing negative input signals to the predriver circuit 132. The input signals may include both positive signals (datap) and negative signals (datan) for purpose of differential transmission. Similarly, the output terminals 161 may be used for transmitting positive signals (outp) and output terminals 162 for transmitting negative signals (outn). Output terminals 161 and 162 may be further coupled to other elements of the differential transmission circuit, e.g., chip pads (not shown).

In various embodiments, the transmitter 100 may include P-side main driver switches 151 (swp) for driving the positive signals and N-side main driver switches 152 (swn) for driving negative signals. The switches 151 and 152 may be coupled in series with passive termination resistors, such as P-side resistors 141 (Rp) and N-side resistors 142 (Rn). Terminal resistors 141 and 142 may be used to develop the differential output voltages.

In various embodiments, the transmitter 100 may also include predriver circuit 131 and 132 for predriving the positive input signal (datap) and the negative input signal (datan). P-side predriver 131 may be configured to drive the P-side switches 151 of the driver, and N-side predriver 132 may be configured to drive the N-side switches 152 of the driver. In various embodiments, the predrivers 131 and 132 may be structurally similarly to each other. Further details of the predriver 131 and 132 will be provided in later parts of this disclosure.

In various embodiments, the transmitter 100 may include a main current source 190 to provide a constant current source to the transmitter 100. A constant electric current, e.g., 20 mA, produced by the current source 190 may be split between the two branches, i.e., the P-side and the N-side, of terminal resistors 141 and 142, thereby creating the output voltages for the output terminals 161 and 162 in accordance with the input signal. The switching of the signals may be achieved by redirecting the current from one branch to the other. This type of driver configuration may be referred to as a current-mode driver. In various embodiments, a current-mode driver may produce lower noise due to the fact that currents are not switched on and off all the time compared to a traditional voltage-mode driver.

The input signals, datap and datan, and the output signals, outp and outn, may be digital or analog. Even though only a single pair of positive input/output terminals and a single pair of negative input/output terminals are depicted in FIG. 1, in various embodiments, each input/output terminal may further comprise many terminals for transmitting multiple bits of the input/output signal, as will be described in more detailed fashion in later parts of this disclosure. Similarly, the main driver switches 151 and 152, the predrivers 131 and 132, and the termination resistors 141 and 142 may also comprise a plurality of switches, transistors and resistors, in accordance to the number of bits of the input signal, as will be described later.

Figure 2:
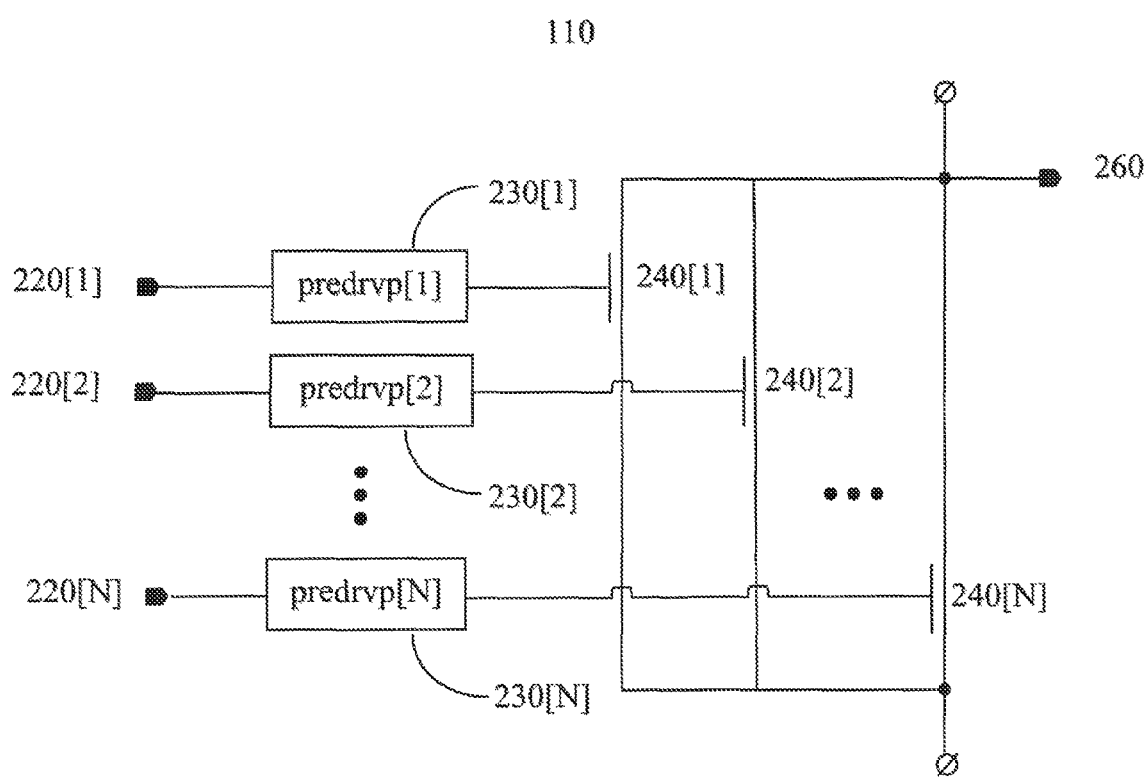
FIG. 2 illustrates in more detailed fashion a predriver circuit coupled with a main driver circuit, in particular, the area within the dashed lines as outlined in FIG. 1, in accordance with various embodiments.

FIG. 2 illustrates in more detailed fashion a predriver circuit 230 coupled with the main driver circuit, in particular, the area 110 outlined by the dashed lines in FIG. 1. In various embodiments, the P-side predriver 131 and N-side predriver 132 may have similar structures. Accordingly, only the P-side predriver 131 is illustrated. In various embodiments, the coupling between the N-side predriver 132 and the N-side switches 152 may likewise be similarly structured.

As illustrated in FIG. 2, the predriver 230 may be coupled to the main driver switches 240, in accordance with various embodiments. The P-side switches 240 may comprise a plurality of binary-weighted switches corresponding to the number of ordered bits of the P-side input signal. For example, the P-side input signal may comprise N bits, where N is an integer and N is greater than or equal to 1. The least significant bit (LSB) of the input signal, 220[1], may be coupled with switch 240[1]. The next higher bit, 220[2], may be coupled with switch 240[2], so on and so forth. And the most significant bit (MSB), 220[N], may be coupled with switch 240[N]. Switch 240[1] may have a initial size of certain width and length, represented as W. Switch 240[2] may have a size of 2 W. Switch 240[N] may have a size of $2^{(N-1)}W$. This type of switch configuration may be referred to as binary-weighted switches because the size of each switch is progressively larger as a power of 2. The switches may also be referred to as being weighted based on a coefficient (or basis) of 2. The size of the switches, in general, may correspond to the strength of the switches. The bigger the size, the bigger the load a switch may drive. With a binary-weighted structure, the switches 240 may be able to transmit multiple bits of signals at different deemphasis levels by turning on/off various parts of the structure.

As illustrated in FIG. 2, the P-side predriver 230 may also include a plurality of predriver cells 230[1], 230[2] to 230[N], corresponding to the number of ordered bits of the P-side input signal. The predriver cells 230 may be coupled to the respective bits 220 of the input signal and the respective switches 240 of the main driver, thereby predriving the input signal prior to the main driver.

FIG. 3 illustrates in more detailed fashion a predriver cell 300 in accordance with various embodiments. In embodiments, the predriver cell 300 may include an input terminal 320 for accepting input signals and an output terminal 360 for delivering the output of the predriver cell 300 to the respective driver switch 240. The predriver cell 300 may comprise a transistor pair, PMOS 330 and a NMOS 340, coupled in series. The transistor pair, including the PMOS 330 and the NMOS 340, may be configured in a manner similar to a CMOS inverter. The NMOS 340 may be further coupled in series to a diode-connected NMOS 350. The PMOS 330 may be coupled to the Vcc and the diode-connected NMOS 350 may be coupled to the Vss (e.g., ground), as shown.

In various embodiments, when the input signal to the predriver 300 is "high" (e.g., a logical "1"), the PMOS 330 may be in a closed position (i.e., switched off), while the NMOS 340 stays in an opened position (i.e., switched on). Therefore, the NMOS 340 may be referred to as a pull-down transistor. Similarly, when the input signal is "low" (e.g., a logical "0"), the NMOS 340 may be in a closed position (switched off) while the PMOS 330 may stay in an opened position (switched on). As such, the PMOS 330 may be referred to as a pull-up transistor.

In various embodiments, when the output of the predriver cell 300 is "high", e.g. a logical "1," the voltage at the output terminal may be around Vcc. However, when the output of the predriver cell 300 is "low," the voltage at the output terminal 360 may be held around the threshold voltage, Vth, of the diode-connected NMOS 350, rather than Vss (ground), due to bias provided by the diode-connected NMOS 350. Accordingly, the output low voltage of the predriver cell 300, Vol, may be equal to the threshold voltage, Vth, of the diode-connected NMOS 350. Holding the predriver output low voltage, Vol, at the level of Vth, rather than Vss, may help opening of a closed NMOS transistor of the switch 240 faster, thereby reducing up/down output signal mismatch, which may lead to less glitches during signal transitions and more stabilized transmission AC common mode voltages. In various embodiments, the diode-connected NMOS 350 may not be used, i.e. NMOS 340 may be connected to ground directly. In various embodiments, the diode-connected NMOS 350 may be replaced with a regular diode with a relatively low threshold voltage.

FIG. 4 illustrates in more detailed fashion a predriver 400 comprising a plurality of the predriver cells 410, in accordance with various embodiments. In various embodiments, the P-side predriver and the N-side predriver may have similar structures. Accordingly, only one side of the predriver is illustrated in FIG. 4.

In embodiments, as illustrated, a plurality of similarly structured predriver cells 410 may be coupled in parallel to build a P-side predriver or an N-side predriver. Each input terminal 460 of the predriver cell 410 may be provided to receive a respective bit of the input signal. For example, the predriver cell 410[1] may be coupled with the LSB of the input signal, the predriver cell 410[2] may be coupled with the next higher bit, and the predriver cell 410[N] may be coupled with the MSB of the input signal. Similarly, each output terminal 470 of the predriver cell 410 may be further coupled to the respective switches 240 of the driver circuit (not shown).

In various embodiments, the pull-down transistors 440 and the diode-connected transistor 450 may both be weighted based on a pull-down coefficient. The pull-down transistors 440 and diode-connected transistors 450 may be binary-weighted in similar fashion as switches 240, as described earlier, in order to produce a substantially simultaneous switch closing and opening between the predriver and the main driver during a down transition. Accordingly, the pull-down transistor 440[1] and the diode-connected transistor 450[1] corresponding to the LSB of the input signal may have an initial size of W. The transistor 440[2] and 450[2] corresponding to the next higher bit of the input signal may have a size of 2 W, so on and so forth. The transistor 440[N] and 450[N] corresponding to the MSB of the input signal may have a size of $2^{(N-1)}W$. Alternatively, as illustrated, the weight of transistors 440[N] and 450[N] may be represented as 2*W[N−1], wherein W[N−1] represents the weight of previous bit transistors.

With the pull-down transistor 440 and the diode-connected transistor 450 being weighted similarly to the main driver switches 240, the predriver 400 may produce a simultaneous down-transition curve for every bit of the input signal that matches the down-transition curves of the output of the driver switches 240.

As illustrated in FIG. 4, the pull-up transistor 430[1] may correspond to the LSB of the input signal, and the pull-up transistor 430[N] may correspond to the MSB of the input signal. In various embodiments, the pull-up transistors 430 may be weighted based on a pull-up coefficient that may or may not be the same as the pull-down coefficient. In embodiments, the pull-up coefficient may be smaller than the pull-down coefficient. For example, as illustrated, a pull-up coefficient of 1.8 may be used. Accordingly, the pull-up transistor 430[1] corresponding to the LSB of the input signal may also have an initial size of W. However, the pull-up transistor 430[2] corresponding to the next higher bit of the input signal may only have a size of 1.8 W, so on and so forth. Pull-up transistor 430[N] corresponding to the MSB of the input signal may only have a size of 1.8^(N−1)W. Alternatively, as illustrated, the weight of pull-up transistor 430[N] may be represented as 1.8*W[N−1], wherein W[N−1] represents the weight of previous bit transistor.

In various embodiments, as illustrated, the size of the pull-up transistor 430[1] may equal to the size of the pull-down transistor 440[1], thereby having the same pull-up and pull-down strength with regard to the LSB of the input signal. However, as the bit order increases from the predriver cell 410[2] to 410[N], the size of the pull-up transistor 430 may be increasing smaller compared to the size of the pull-down transistor 440. The differences in size between the pull-up transistors and pull-down transistors may be represented by P/N ratio. Accordingly, the P/N ratio may continuously decrease with the increase of the bit order of the input signal as illustrated in Table 1 below.

Table 1 illustrates the different coefficients and the corresponding predriver P/N ratios for the plurality of predriver cells 410 in accordance with various embodiments. As previously described, the pull-down transistors 440 may be binary-weighted (with a pull-down coefficient (or basis) of 2), and the pull-up transistors 430 may be weighted based on a pull-up coefficient of 1.8. The weight of each subsequent bit transistor may be obtained by multiplying previous bit transistor weight W[N−1] by its coefficient. Weight 1 corresponds to the initial sizes of the pull-up transistor 430[1] and pull-down transistor 440[1], which may vary from process to process and depends on the load of the predriver.

TABLE 1

| | Pull down | | Pull up | | |
| --- | --- | --- | --- | --- | --- |
| bit | Coeff | Weight | Coeff | Weight | P/N ratio |
| 1 | — | 1 | — | 1 | 1 |
| 2 | 2 | 2 | 1.8 | 1.8 | 0.9 |
| 3 | 2 | 4 | 1.8 | 3.24 | 0.81 |
| 4 | 2 | 8 | 1.8 | 5.83 | 0.73 |
| ... | ... | ... | ... | ... | ... |
| N | 2 | 2 * W[N−1] | 1.8 | 1.8 * W[N−1] | 0.9 * (N−1) |

As illustrated in Table 1, the pull-up transistors of higher order bits may decrease monotonically, providing smaller P/N ratios for higher order bits. This decrease in P/N ratio towards higher order bits may provide relatively weaker pull-up strength for higher order bits than for lower order bits. As such, pull up strength of the predriver 400 may decrease monotonically from lower (weaker) to higher (stronger) order bits. Consequently, during an up transition of the input signal, the output slopes of higher order bits may be slower compared with the slops for lower order bits, producing a staged waveform. This may enable the main driver switches to a staged (gradual) opening during a up transition while still providing simultaneous switches closing during a down transition as pull-down transistors 440 maintain the same binary ratio as the main driver switches 240.

As the transmission frequency increases over time, high speed I/O buses may become more and more sensitive to up/down skew of the transmitted signal. The staged waveform produced by the predriver 400 may better match the up/down transition of the main driver 240, thereby reducing the jitter and AC common mode glitches for the differential transmitter 100. Having a stable AC common mode voltage of the transmitted signal may also improve the system margin by providing a bigger differential eye width and height of the transmitted differential signal.

Although the same initial size W is illustrated in FIG. 4 and Table 1, in various embodiments, the initial sizes of the pull-up transistor 430[1], the pull-down transistor 440[1] and the diode-connected transistor 450[1] may or may not be the same. Even though the pull-up coefficient of 1.8 is illustrated in FIG. 4 and Table 1, in various embodiments, the pull-up coefficient may vary depending on the number of bits and the required slope of the last bit. Lower coefficient may be used to produce a slower up transition slope. However, slower transitions of the higher order bits may limit operation frequency of the differential transmitter.

FIG. 4 illustrates a predriver circuit based on N-type current source differential transmitter with NMOS switches. In various embodiments, a P-type current source may also be used, in which case Voh may be set to Vtp of the diode-connected PMOS and pull-down transitions should have weakened structure.

Figure 5:
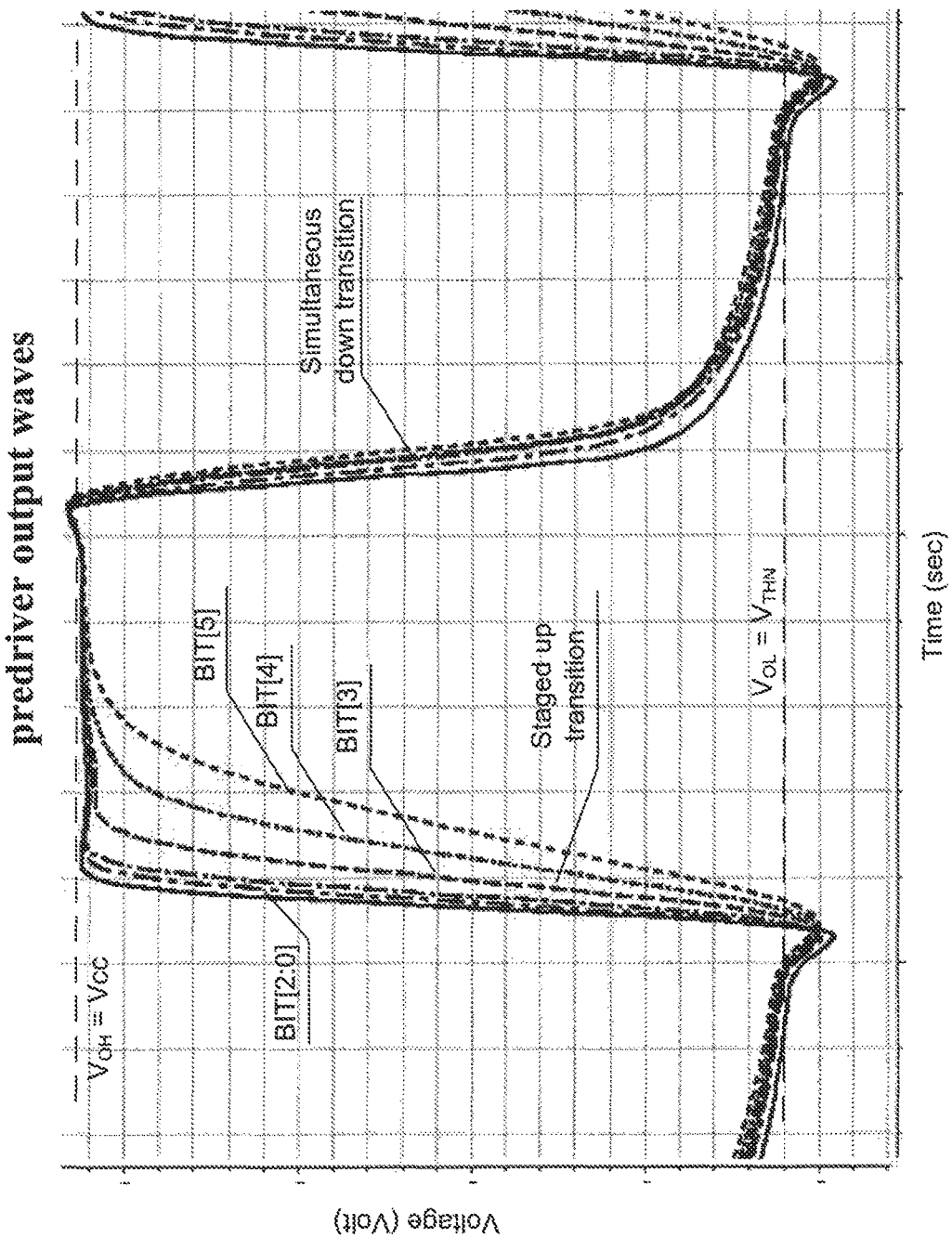
FIG. 5 illustrates the staged waveforms of the predriver obtained in simulation, in accordance with various embodiments.

FIG. 5 illustrates the staged waveforms of the predriver obtained in simulation in accordance with various embodiments. As illustrated by the simulation results, during an up transition, the output slopes of higher order bits gradually slows down. The down transition, however, may still be substantially simultaneous for all the bits. Also as illustrated, the Vol of the predriver may not reach the level of Vss (i.e., ground) but instead be maintained around the threshold voltage, Vth, of the diode-connected NMOS device. In various embodiments, the staged waveform output of the predriver may have significant advantages in reducing the up/down mismatch between the predriver and the main driver, thereby potentially improving the common-mode stability, particularly for a high-speed (e.g., 5 Gb/s) differential transmitter.

Figure 6:
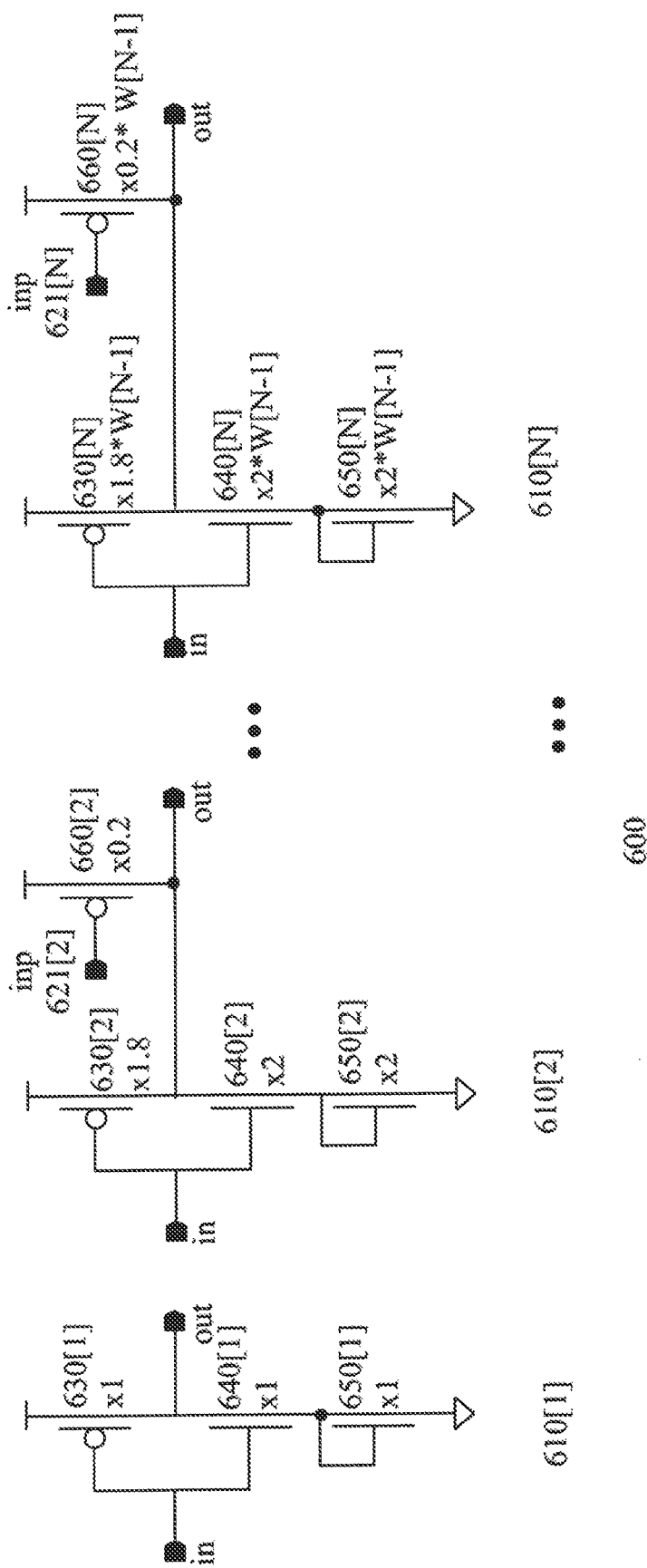
FIG. 6 illustrates another embodiment of the predriver, wherein the staging effect may be dynamically disabled during deemphasis exit transitions, in accordance with various embodiments.

FIG. 6 illustrates another embodiment of the predriver 600, wherein the staging effect may be dynamically disabled during deemphasis exit transitions by using e.g., additional complementary pull-up transistors 660. Deemphasis exit transition may refer to a transition from deemphasis mode to full-swing mode. During a deemphasis exit transition, the differential signal may start the transition from different voltage levels and therefore may lead to undesired glitch in AC common-mode, which in turn may lead to transmitter performance degradation. The predriver 600 as illustrated in FIG. 6 may compensate for that effect by dynamically increasing the pull-up strength of the predriver during a deemphasis exit transition.

In embodiments, as illustrated, the complementary PMOS pull-up transistors 660 may be coupled in parallel to the respective weakened pull-up transistors of the staged predriver cells, from 610[2] to 610[N]. In various embodiments, the predriver cell 610[1] may not have a weakened pull-up transistor 630[1], and a complementary pull-up transistor may not be necessary for the predriver cell 610[1]. The complementary pull-up transistor 660 may be dynamically enabled or disabled by control signals 621 in accordance with the input signal. Further details of the control signals 621 will be provided in later parts of this specification.

In various embodiments, the size of the complementary pull-up transistor 660 may correspond to the difference in size between the pull-down transistors 640 and the pull-up transistors 630, e.g., the missing part of the P/N ratio. As illustrated in FIG. 6, if the pull-down transistors 640 are binary-weighted and the pull-up transistors 630 are weighted by a coefficient of 1.8, then complementary pull-up transistors 660 may be weighted by a coefficient of 0.2, which corresponds to the difference in size between the pull-down coefficient and the pull-up coefficient. As such, the complementary pull-up transistors 660 may make-up the weakened strength of the pull-up transistors 630 during an up transition. With the additional complementary pull-up transistors dynamically enabled during a deemphasis exit transition, the up transition of all the bits may be synchronized. This may reduce the undesired AC common mode glitch during the deemphasis exit transition.

In various embodiments, the size of the complementary pull-up transistor 660 may be bigger than the size difference between the pull-down transistor 640 and the pull-up transistor 630. The exact size of the complementary pull-up transistor 660 may be subject to additional tuning.

Figure 7:
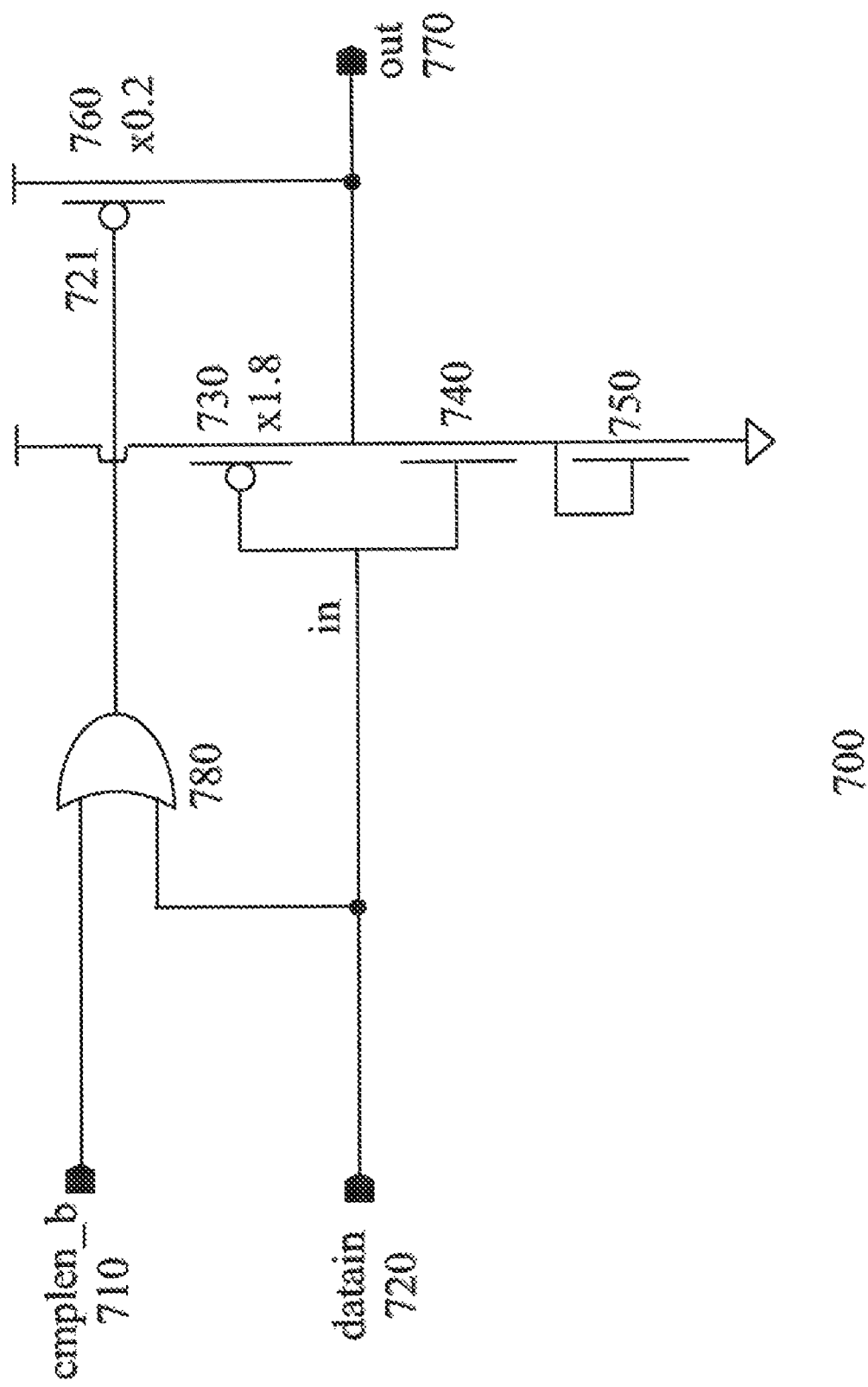
FIG. 7 illustrates in more detailed fashion a predriver cell comprising a complementary pull-up transistor, in accordance with various embodiments.

FIG. 7 illustrates in more detailed fashion a predriver cell 710 comprising a complementary pull-up transistor 760 in accordance with various embodiments. Since the predriver cells 610[2] to 610[N] may be similarly configured, only the first predriver cell 610[2] is illustrated in FIG. 7. In embodiments, as illustrated, the complementary pull-up transistor 760 may be coupled to the output of an OR gate 780. The voltage level at terminal 721 is denoted as Vinp. The two input terminals, 720 and 710, of the OR gate 780 may be coupled to the input signal, datain, and a complementary control signal, cmplen_b, respectively. In various embodiments, the OR gate 780 may be also replaced by a multiplexer or other logics of similar functionality.

As illustrated, when the control signal cmplen_b is set to "1," Vinp may be equal to Vcc, which may cause the complementary pull-up transistor 760 to be in an off state. In this mode, the predriver may operate as the staged predriver as previously described in FIG. 4. When the control signal cmplen_b is set to "0," Vinp may be equal to datain, which may enable the complementary pull-up transistor 760 to act in sync with the pull-up transistor 730, effectively disabling the staged behavior of the predriver by increasing the pull-up strength of the predriver cell 700. The control signal cmplen_b may be derived from a signal that indicates if the driver is operating in full swing or in deemphasis mode. Signal cmplen_b may be set to 0 during deemphasis exit transitions, or set to 0 during the complete deemphasis state until the exit from deemphasis finishes, and set to 1 for all other modes. As the complen_b signal being dynamically switched based on the input signal, during normal operation the predriver may provide the staged behavior while during deemphasis exit transitions the staged behavior may be dynamically eliminated. Dynamically disabling staging function of the predriver 600 during deemphasis exit transitions may provide a similar up transition slope for all the bits of the input signal. By speeding up the up transition of the predriver for deemphasis exit transitions, the opening of the main driver switches may also be faster, thereby improving the common-mode stability for deemphasis exit transitions.

FIG. 8 illustrates simulation results of the differential transmitter output waves (a) without staged predriver, (b) with staged predriver and (c) with dynamically staged predriver in accordance with various embodiments. As illustrated, the dynamic staged predriver may further reduce the AC common-mode glitches and provide a more stable AC common-mode voltage and more symmetric differential eye diagram. Simulation results of the main driver output AC common-mode peak-to-peak voltage over different process, voltage and temperature (PVT), may show that the dynamic staged predriver in accordance with various embodiments may improve the AC common-mode peak-to-peak voltage by 10-30 mV under certain conditions. The AC common-mode peak-to-peak voltage may be measured as $\max(V_{D+}+V_{D-})/2-\min(V_{D+}+V_{D-})/2$, as defined in the PCI Express Base Specification, revision 2.1, released Mar. 4, 2009.

In various embodiments, the predrivers 400 or 600 illustrated in FIGS. 4 and 6 may operate in different modes or topologies. For example, the predriver 400 or 600 may operate under AC coupled topology, where the transmitter and the receiver may be separated by serial capacitors; under DC coupled topology, where transmitter and receiver may be connected directly to each other; or under full swing or half swing topology, where signaling levels may be different. The predriver 400 or 600 may also operate under systems with speed requirements other than 5 Gb/s.

Figure 9:
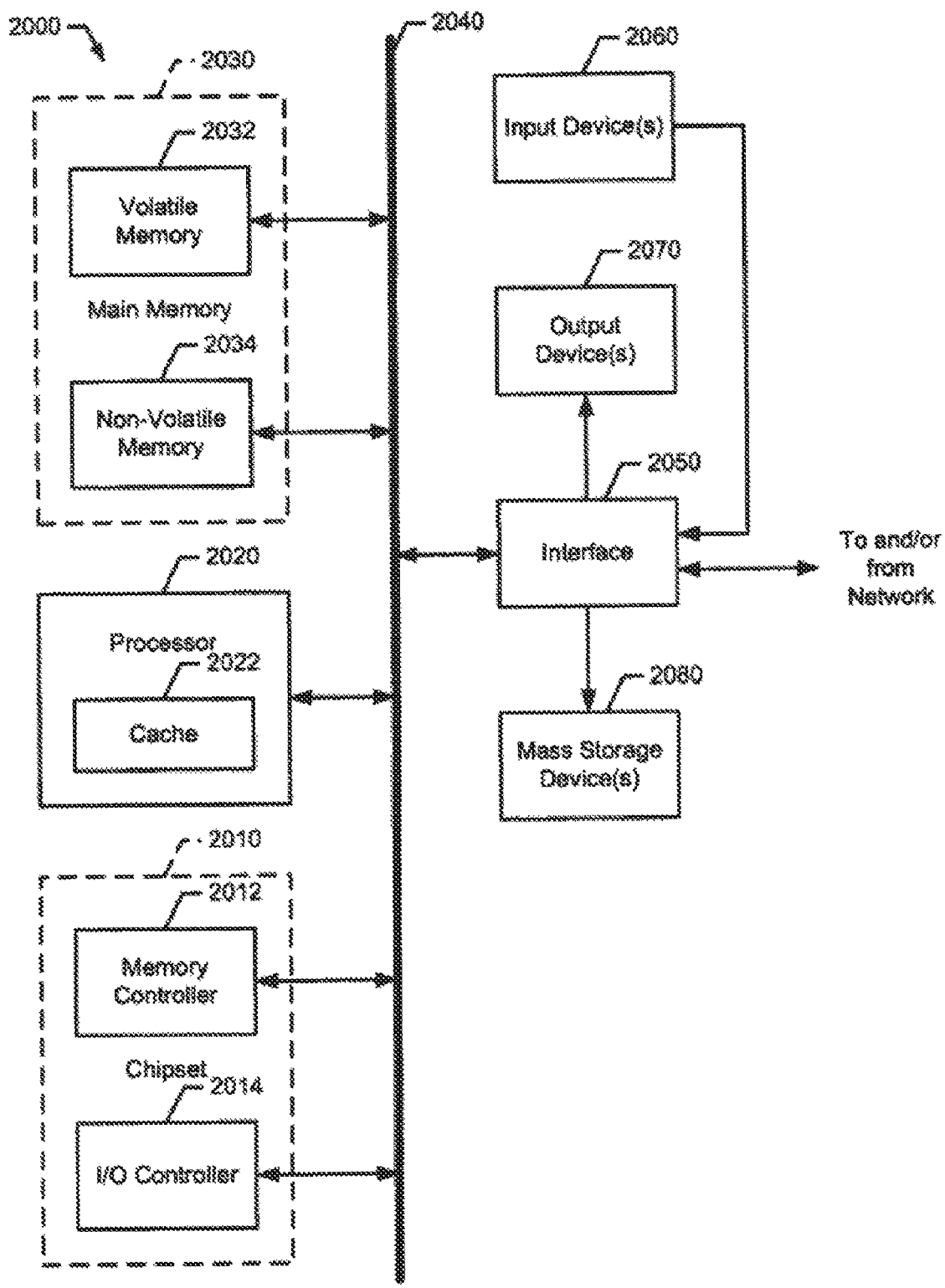
FIG. 9 illustrates a block diagram of an apparatus configured to practice the circuits and methods disclosed herein in accordance with various embodiments.

FIG. 9 illustrates a block diagram of an example apparatus comprising a processor system 2000 configured with the circuits disclosed herein. The processor system 2000 may be a desktop computer, a laptop computer, a handheld computer, a tablet computer, a Personal Digital Assistant (PDA), a mobile phone, a media player, a server, an Internet appliance, and/or any other type of processor based device.

The processor system 2000 illustrated in FIG. 9 may include a chipset 2010, which includes a memory controller 2012 and an input/output (I/O) controller 2014. The chipset 2010 may provide memory and I/O management functions as well as a plurality of general purpose and/or special purpose registers, timers, etc. that are accessible or used by a processor 2020. The processor 2020 may be implemented using one or more processors, WLAN components, WMAN components, WWAN components, and/or other suitable processing components. For example, the processor 2020 may be implemented using one or more of the Intel® Pentium® technology, the Intel® Itanium® technology, the Intel® Centrino™ technology, the Intel® Xeon™ technology, and/or the Intel® XScale® technology. In the alternative, other processing technology may be used to implement the processor 2020. The processor 2020 may include a cache 2022, which may be implemented using a first-level unified cache (L1), a second-level unified cache (L2), a third-level unified cache (L3), and/or any other suitable structures to store data.

The memory controller 2012 may perform functions that enable the processor 2020 to access and communicate with a main memory 2030 including a volatile memory 2032 and a non-volatile memory 2034 via a bus 2040. The volatile memory 2032 may be implemented by Synchronous Dynamic Random Access Memory (SDRAM), Dynamic Random Access Memory (DRAM), RAMBUS Dynamic Random Access Memory (RDRAM), and/or any other type of random access memory device. The non-volatile memory 2034 may be implemented using flash memory, Read Only Memory (ROM), Electrically Erasable Programmable Read Only Memory (EEPROM), and/or any other desired type of memory device.

The processor system 2000 may also include an interface circuit 2050 that is coupled to the bus 2040. The interface circuit 2050 may be implemented using any type of interface standard such as an Ethernet interface, a universal serial bus (USB), a third generation input/output interface (3GIO) interface, PCI Express, Serial ATA, PATA, and/or any other suitable type of interface. In particular, the interface circuit 2050 may be adapted to implement the differential transmitter circuit as previously described, including the predrivers illustrated in FIGS. 4 and 6.

One or more input devices 2060 may be coupled to the interface circuit 2050. The input device(s) 2060 permit an individual to enter data and commands into the processor 2020. For example, the input device(s) 2060 may be implemented by a keyboard, a mouse, a touch-sensitive display, a track pad, a track ball, an isopoint, and/or a voice recognition system.

One or more output devices 2070 may also be coupled to the interface circuit 2050. For example, the output device(s) 2070 may be implemented by display devices (e.g., a light emitting display (LED), a liquid crystal display (LCD), a cathode ray tube (CRT) display, a printer and/or speakers). The interface circuit 2050 may include, among other things, a graphics driver card.

The processor system 2000 may also include one or more mass storage devices 2080 to store software and data. Examples of such mass storage device(s) 2080 include floppy disks and drives, hard disk drives, compact disks and drives, and digital versatile disks (DVD) and drives.

The interface circuit 2050 may also include a communication device such as a modem or a network interface card to facilitate exchange of data with external computers via a network. The communication link between the processor system 2000 and the network may be any type of network connection such as an Ethernet connection, a digital subscriber line (DSL), a telephone line, a cellular telephone system, a coaxial cable, etc.

Access to the input device(s) 2060, the output device(s) 2070, the mass storage device(s) 2080 and/or the network may be controlled by the I/O controller 2014. In particular, the I/O controller 2014 may perform functions that enable the processor 2020 to communicate with the input device(s) 2060, the output device(s) 2070, the mass storage device(s) 2080 and/or the network via the bus 2040 and the interface circuit 2050.

In various embodiments, other elements of FIG. 9 may also practice the circuits of the present disclosure earlier described. Further, while the components shown in FIG. 9 are depicted as separate blocks within the processor system 2000, the functions performed by some of these blocks may be integrated within a single semiconductor circuit or may be implemented using two or more separate integrated circuits. For example, although the memory controller 2012 and the I/O controller 2014 are depicted as separate blocks within the chipset 2010, the memory controller 2012 and the I/O controller 2014 may be integrated within a single semiconductor circuit.

Although certain example methods, apparatus, and articles of manufacture have been described herein, the scope of coverage of this disclosure is not limited thereto. On the contrary, this disclosure covers all methods, apparatus, and articles of manufacture fairly falling within the scope of the appended claims either literally or under the doctrine of equivalents. For example, although the above discloses example systems including, among other components, software or firmware executed on hardware, it should be noted that such systems are merely illustrative and should not be considered as limiting. In particular, it is contemplated that any or all of the disclosed hardware, software, and/or firmware components could be embodied exclusively in hardware, exclusively in software, exclusively in firmware or in some combination of hardware, software, and/or firmware.

What is claimed is:

1. An apparatus comprising:
 a first circuit cell having a first transistor coupled in series to a second transistor to receive a least significant bit of a input signal; and
 a second circuit cell having a third transistor coupled in series to a fourth transistor to receive a bit of the input signal that is next order higher than the least significant bit, wherein:
  the first and third transistors are transistors of a first type, and the second and fourth transistors are transistors of a second type that is different from the first type,
  the third transistor is structurally larger than the first transistor by a first coefficient, wherein the first coefficient is a ratio between a geometric size of the third transistor and a geometric size of the first transistor,
  the fourth transistor is structurally larger than the second transistor by a second coefficient, wherein the second coefficient is a ratio between a geometric size of the fourth transistor and a geometric size of the second transistor, and
  the second coefficient is different from the first coefficient.

2. The apparatus of claim 1, wherein the first transistor is a n-type transistor, the second transistor is a p-type transistor, the third transistor is a n-type transistor, and the fourth transistor is a p-type transistor.

3. The apparatus of claim 1, further comprising a first diode-connected transistor and a second diode-connected transistor coupled in series to the first and third transistors of the respective first and second circuit cells.

4. The apparatus of claim 3, wherein the second diode-connected transistor is structurally bigger in size than the first diode-connected transistor by the first coefficient.

5. The apparatus of claim 1, wherein the first coefficient is about 2 and wherein the second coefficient is about 1.8.

6. The apparatus of claim 1, further comprising a complementary transistor which is coupled in parallel to the fourth transistor of the second circuit cell and coupled in series to the third transistor of the second circuit cell, wherein the complementary transistor is a transistor of the second type, and wherein the complementary transistor is configured to receive a control signal adapted to dynamically enable the complementary transistor during deemphasis exit transitions.

7. The apparatus of claim 6, wherein the complementary transistor is structured based on a difference in size between the third transistor and the fourth transistor of the second circuit cell.

8. The apparatus of claim 6, further comprising
 a plurality of circuit cells configured to receive remaining bits of the input signal respectively, respective ones of the plurality of circuit cells having a fifth transistor, a sixth transistor, and a diode-connected transistor coupled in series, wherein:
  the fifth transistor is a transistor of the first type, and the sixth transistor is a transistor of the second type;
  the fifth transistors of the respective ones of the plurality of circuit cells are structurally larger in size than corresponding fifth transistors of circuit cells of immediate lower order bits by the first coefficient; and the sixth transistors of the respective ones of the plurality of circuit cells are structurally larger in size than corresponding sixth transistors of the circuit cells of immediate lower order bits by the second coefficient.

9. The apparatus of claim 8, further comprising a plurality of complementary transistors coupled in parallel with corresponding sixth transistors of the respective ones of the plurality of circuit cells, the plurality of complementary transistors configured to respectively receive a plurality of control signals adapted to dynamically enable respective ones of the plurality of complementary transistors during deemphasis exit transitions.

10. The apparatus of claim 1, wherein the apparatus is a pre-driver circuit for a differential transmitter configured to drive output signals differentially.

11. The apparatus of claim 1, wherein the apparatus is an integrated circuit comprising a current-mode serial I/O driver circuit configured to drive output signals differentially.

12. A method comprising:
receiving an input signal having a plurality of ordered bits by a predriver circuit having a plurality of circuit cells, wherein the plurality of circuit cells are configured to receive the plurality of ordered bits, respectively, and wherein respective ones of the plurality of circuit cells comprise a first transistor coupled in series with a second transistor; and
predriving the input signal and generating, in response, an output signal having the plurality of ordered bits corresponding to the plurality of ordered bits of the input signal, including:
switching on the respective first transistors of the plurality of circuit cells to down transition the plurality of ordered bits of the output signal simultaneously, and
switching on the respective second transistors of the plurality of circuit cells gradually, from cells of lower order bits to cells of higher order bits, to produce a staged waveform where transition slopes of the higher order bits are slower compared to transition slopes of the lower order bits, to up transition lower order bits faster than higher order bits.

13. The method of claim 12, wherein the first transistor of the respective ones of the plurality of circuit cells is a n-type transistor, and wherein the second transistor of the respective ones of the plurality of circuit cells is a p-type transistor.

14. The method of claim 12, wherein the respective ones of the circuit cells further comprise a third transistor, and the method further comprising maintaining respectively output "low" voltage (Vol) of the respective ones of the plurality of circuit cells around threshold voltage (Vth) of the third transistor.

15. The method of claim 14, wherein the third transistor is a diode-connected transistor.

16. The method of claim 12, wherein the first transistors of the plurality of circuit cells are structurally weighted based on a first coefficient with regard to corresponding first transistors of circuit cells of immediate lower order bits, and wherein the second transistors of the plurality of circuit cells are structurally weighted based on a second coefficient with regard to corresponding second transistors of circuit cells of immediate lower order bits, and the second coefficient is smaller than the first coefficient.

17. The method of claim 12, wherein the respective ones of the plurality of circuit cells other than a circuit cell corresponding to a least significant bit of the input signal further comprise a fourth transistor, and the method further including:
switching on both the second transistor and the fourth transistor of the respective ones of the plurality of circuit cells to up transition the plurality of output signals of the ordered bits simultaneously in response to a deemphasis exit transition in the input signals.

18. The method of claim 17, wherein the fourth transistor is a complementary pull-up transistor.

19. A system comprising:
a source configured to provide a current;
a positive driver and a negative driver coupled to the source;
a positive predriver and a negative predriver respectively coupled to the positive driver and the negative driver, and configured to respectively receive a positive and a negative input signal associated with a plurality of bits, wherein the respective positive and negative predrivers comprise:
a plurality of circuit cells configured to receive respective ones of the plurality of bits of the positive or negative input signal, respective ones of the plurality of circuit cells having a first transistor coupled in series with a second transistor, wherein
the first transistors are transistors of a first type, and the second transistors are transistors of a second type that is different from the first type,
the first transistor of the respective ones of the plurality of circuit cells is physically larger than a corresponding first transistor of circuit cells of immediate lower order bits by a first coefficient, wherein the first coefficient is a ratio between geometric sizes of the first transistor of the respective ones of the plurality of circuit cells and the corresponding first transistor of the circuit cells of immediate lower order bits,
the second transistor of the respective ones of the plurality of circuit cells is physically larger than a corresponding second transistor of circuit cells of immediate lower order bits, wherein the second coefficient is a ratio between geometric sizes of the second transistor of the respective ones of the plurality of circuit cells and the corresponding second transistor of the circuit cells of immediate lower order bits, and
the second coefficient being different from the first coefficient.

20. The system of claim 19, wherein the first transistor is a n-type transistor and the second transistor is a p-type transistor.

21. The system of claim 20, further comprising a plurality of diode-connected transistors respectively coupled in series to the first transistor and the second transistors of the respective ones of the plurality of circuit cells, wherein respective ones of the plurality of diode-connected transistors are structurally weighted based on the first coefficient with regard to corresponding ones of the plurality of diode-connected transistors of the circuit cells of immediate lower order bits.

22. The system of claim 19, wherein the first coefficient is about 2 and wherein the second coefficient is about 1.8.

23. The system of claim 20, further comprising a plurality of complementary transistors which are respectively coupled in parallel to the second transistors of the respective ones of the plurality of circuit cells and coupled in series to the first transistors of the respective ones of the plurality of circuit cells, other than a circuit cell configured to receive a least significant bit of the input signal, wherein the plurality of complementary transistors are configured to respectively receive control signals adapted to dynamically enable respective ones of the plurality of complementary transistors during deemphasis exit transitions.

24. The system of claim 23, wherein the respective ones of the plurality of complementary transistors are structurally weighted based on a third coefficient with regard to corresponding complementary transistors of circuit cells of immediate lower order bits, the third coefficient based on a difference between the first and the second coefficient.

* * * * *